(12) United States Patent  (10) Patent No.: US 7,444,602 B2
Nakamura  (45) Date of Patent: Oct. 28, 2008

(54) METHOD OF GENERATING ASIC DESIGN DATABASE

(75) Inventor: Akihisa Nakamura, Yokohama (JP)

(73) Assignees: Kabushiki Kaisha Toshiba, Tokyo (JP); Toshiba Tec Kabushiki Kaisha, Tokyo (JP)

( * ) Notice: Subject to any disclaimer, the term of this patent is extended or adjusted under 35 U.S.C. 154(b) by 419 days.

(21) Appl. No.: 11/352,288

(22) Filed: Feb. 13, 2006

(65) Prior Publication Data

US 2006/0130005 A1  Jun. 15, 2006

Related U.S. Application Data

(62) Division of application No. 10/025,788, filed on Dec. 26, 2001, now abandoned.

(51) Int. Cl.
G06F 17/50 (2006.01)
(52) U.S. Cl. .................. 716/1; 716/4; 716/5; 716/6
(58) Field of Classification Search ............... 716/1, 716/4–6
See application file for complete search history.

(56) References Cited

U.S. PATENT DOCUMENTS

| | | | |
|---|---|---|---|
| 5,768,145 A | 6/1998 | Roethig | |
| 5,841,663 A | 11/1998 | Sharma et al. | |
| 6,026,228 A | 2/2000 | Imai et al. | |
| 6,654,945 B1 | 11/2003 | Nakayama et al. | |
| 6,694,491 B1 | 2/2004 | Osann, Jr. et al. | |
| 6,959,428 B2 * | 10/2005 | Broberg et al. | 716/18 |
| 7,240,309 B2 * | 7/2007 | Saito et al. | 716/5 |

FOREIGN PATENT DOCUMENTS

| | | |
|---|---|---|
| JP | 10-171857 A | 6/1998 |
| JP | 2000-123061 A | 4/2000 |
| JP | 2001-067384 A | 3/2001 |

* cited by examiner

*Primary Examiner*—Jack Chiang
*Assistant Examiner*—Brandon W Bowers
(74) *Attorney, Agent, or Firm*—Foley & Lardner LLP

(57) ABSTRACT

When a function design has been carried out by an RTL description using an HDL language, a CPU of an integrated circuit design support apparatus writes data such as a simulation time, a layout area, a timing and a power consumption into a header portion of the RTL description. The CPU stores, as one file, the RTL description comprising the header portion serving as a reuse design database, and an entity portion, in a hard disk drive.

7 Claims, 5 Drawing Sheets

```
RTL description

-- Copyright (c) * * *
--
-- ----------------------------------------------
-- Entity name
-- Simulation time          799996nS
-- Layout area information  31387.996094 gate
-- Timing information       -7.70nS
-- Power consumption        5.00071mA
-- This contains the 10 jbig_core submodules and stitches them togeather
--
--
--
--       jbig_control.vhd,   jbig_mem control.vhd,   jbig_encoder.vhd,
jbig_decoder.vhd,
--       jbig_cx_mem.vhd,    jbig_cx_gen.vhd,        jbig_preprocessor.vhd,
jbig_tp_mod.vhd,
-- jbig_Add_map.vhd,-jbig_table.vhd
--
--
--
-- ----------------------------------------------

LIBRARY ieee;
USE ieee.std_logic_1164.all;
USE ieee.std_logic_unsigned.all;
USE work.lib_pkg.all;

ENTITY jbig_core IS
    PORT(
        clk              : IN std_logic;
        reset_n          : IN std_logic;

jbig_done        : OUT std_logic;
        new_ydsize       : OUT std_logic;
        err_val          : OUT std_logic_vector(3 DOWNTO 0);

autosave         : IN std_logic;
        enable           : IN std_logic;
        autoclr          : IN std_logic;

init_in_bit      : IN std_logic;
        cd_bit_off       : OUT std_logic;
        init_out_bit     : IN std_logic;
        out_hold_byte    : OUT std_logic;

pixels_in        : IN std_logic_vector(15 DOWNTO 0);
        In_lines         : IN std_logic_vector(15 DOWNTO 0);
        lines            : IN std_logic_vector(15 DOWNTO 0);
        ctl_jbig         : IN std_logic_vector(15 DOWNTO 0);
```

Header portion

Entity portion

F I G. 3

```
Area information
******************************************
Rerport : area
Design  : scaler1
Version : 2000.11-SP2
Date    : Thu Aug 23 11:24:50 2001
******************************************

Library(s) Used:

cb35os141 (File: /system/DK/rohm/cb35os141_v3t70nf.db)

Number of ports:       442
Number of nets:        12622
Number of cells:       11703
Number of references:  136

Combinational area:    24307.500000
Noncombinational area: 6976.500000
Net Interconnect area: 103.995911

Total cell area:       31284.000000
Total area:            31387.996094
```

FIG. 5

```
Power consumption calculation result
...
...
...
...
Row_Number   1    TOTAL   STATIC   OVERLAP   INTENAL   I/O
PowerAVERAGE =   5.00071  0.28701  0.12731   0.84353
```

FIG. 7

```
Timing information

*******************************************
Report : timing
        -path full
        -delay max
        -max_paths 1
Design : jbig_core
Version: 2000.11-SP2
Date   : Thu Aug 23 20:09:19 2001
*******************************************
*Some/all delay information is back-annotated.
Operating Conditions: WCCOM Library: cb35os141
Wire Load Model Mode: enclosed Startpoint: op_format_req
              (input port clocked by clk)
  Endpoint: cx_wr (output port clocked by clk)
  Path Group: clk
  Path Type: max
  Des/Clust/Port      Wire Load Model        Library
  ------------------------------------------------
  jbig_core           ForQA                  cb35os 141
  jbig_encoder        ForQA                  cb35os 141
  jbig_cx_mem         ForQA                  cb35os 141

Point                                      Incr        Path
  ------------------------------------------------
  clock clk (rise edge)                      0.00        0.00
  clock network delay (ideal)                0.70        0.70
  input external delay                       7.00        7.70f
  op_format_req (in)                         0.00        7.70f
  comp4/op_format_req (jbig_encoder)         0.00        7.70f
  comp4/U2856/Z (GTECH_OR_NOT)               0.00        7.70r
  comp4/U2857/Z (GTECH_OR_NOT)               0.00        7.70r
  comp4/U2858/Z (GTECH_OR_NOT)               0.00        7.70r
  *cell*4285/Z_0 (mselector_n2 m1.model)     0.00        7.70r
  comp4/op_hold (jbig_encoder)               0.00        7.70r
  comp7 /op-hold (jbig_ex_mem)               0.00        7.70r
  comp7/S_1/Z (GTECH_NOT)                    0.00        7.70f
  comp7/S_2/Z (GTECH_AND2)                   0.00        7.70f
  comp7/S_3/Z (GTECH_OR2)                    0.00        7.70f
  comp7/S_4/Z (GTECH_NOT)                    0.00        7.70r
  comp7/cx_wr (jbig_cx_mem)                  0.00        7.70r
  cx_wr (out)                                0.00        7.70r
  data arrival time                                      7.70
  clock-clk (rise edge)                      24.00       24.00
  clock network delay (ideal)                0.70        24.70
  clock uncertainty                          -0.50       24.20
  output external delay                      -14.10      10.10
  data required time                                     10.10
  ------------------------------------------------
  data required time                                     10.10
  data arrival time                                      -7.70
  ------------------------------------------------
  slack (MET)                                            2.40
```

FIG. 6

METHOD OF GENERATING ASIC DESIGN DATABASE

The present application is a divisional of U.S. application Ser. No. 10/025,788, filed Dec. 26, 2001, the entire contents of which are incorporated herein by reference.

BACKGROUND OF THE INVENTION

The present invention relates to a method of generating an ASIC design database, which is important when a large-scale integrated circuit device such as a system LSI is to be designed.

There is known a conventional design method, which uses a database in order to avoid useless repetition at the time of re-designing or disability of design, when a system LSI is to be developed.

In designing an ASIC (Application Specific Integrated Circuit), a designer first analyzes given design specifications, examines architecture candidates, selects a most prospective architecture, and describes the selected architecture using a hardware description language. The act of the describing is called "operation description". The obtained operation description is an operation-level design result. The operation-level design is verified by applying an operation-level simulator or a verifier to this operation-level design result.

Based on the operation description, the designer then produces an RTL (Register Transfer Level) description in which the object of design is described in a register transfer level. The RTL description is automatically generated from the operation description by means of an operation synthesis tool. The generated RTL description is also based on a hardware description language (HDL). The RT level design is verified by applying an RT level simulation tool, etc. to the RTL description.

Following the verification, a net list (gate-level logic circuit description), in which the object of design is described in a gate level on the basis of the RTL description, is generated by means of a logic synthesis tool. The gate-level design is verified by applying a logic simulation tool, etc. to the net list, following which a floor plan is carried out. In the floor plan for the net list, blocks constituting gate-level logic circuits are generally arranged and wired.

Subsequently, based on the result of the floor plan, the gate-level design represented by the net list is evaluated. Specifically, using the information on the arrangement of blocks constituting logic circuits and the information on the wiring of the blocks, the layout area, timing, power consumption, etc. are calculated.

In general, when the data mentioned above is stored, it is divided into specification data and RTL description data.

The specification data contains data on the process time, layout area, power consumption, test cost, etc.

The RTL description data is an RTL description file in units of an entity.

In the methods of constituting the databases, it is necessary to perform a process for extracting the content of specifications after the design is finished. This results in useless procedures in constituting the database.

BRIEF SUMMARY OF THE INVENTION

The object of the present invention is to provide a method of generating an ASIC design database, the method being capable of generating a database necessary for re-use design and efficient information collection, which are necessary when a large-scale integrated circuit device such as a system LSI is to be designed.

In order to achieve the object, the present invention may provide a method of generating an ASIC design database, comprising: extracting, when a function design using description data comprising a header portion and an entity portion has been performed, information necessary for reuse design from various execution results of the entity portion; writing the extracted information necessary for reuse design in the header portion of the description data; and storing, as one file at a predetermined location, the description data comprising the header portion in which the information necessary for reuse is written, and the entity portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 shows an example of a function design using RTL description;

FIG. 5 shows an example of an analysis support (area information);

FIG. 6 shows an example of an analysis report timing information); and

FIG. 7 shows an example of a power consumption calculation result.

DETAILED DESCRIPTION OF THE INVENTION

An embodiment of the present invention will now be described with reference to the accompanying drawings.

Figure 1:
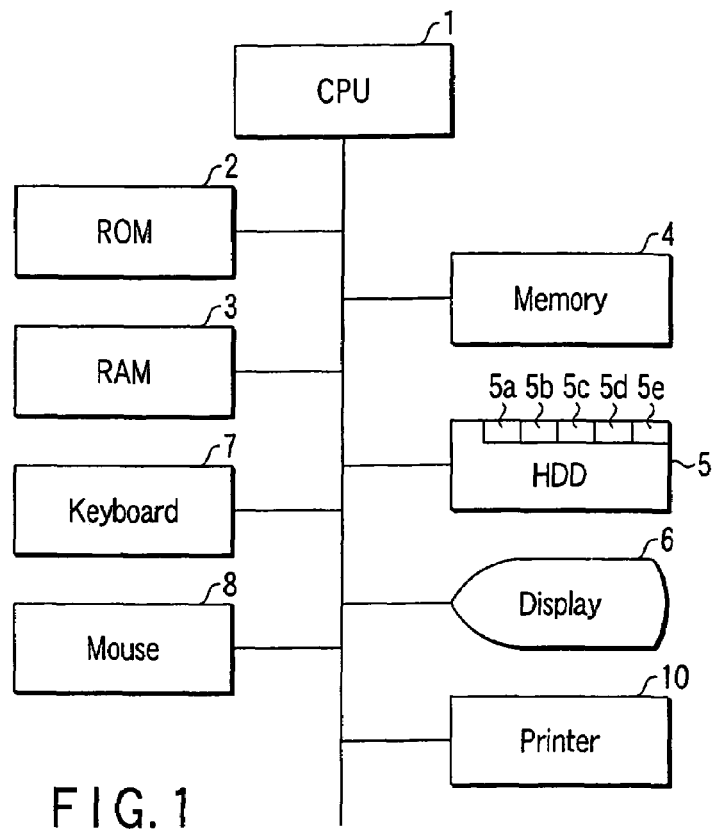
FIG. 1 is a block diagram schematically showing the structure of an IC design support apparatus according to the present invention.

FIG. 1 schematically shows the structure of an integrated circuit design support apparatus according to an ASIC design database generating method of the present invention. The hardware of this IC circuit design support apparatus is a computer system such as a work station.

The IC design support apparatus comprises a CPU 1, a ROM 2, a RAM 3, a memory 4, a hard disk drive (HDD) 5, a display 6, a keyboard 7, a mouse 8, and a printer 10.

The CPU 1 controls the entirety of the apparatus.

The ROM 2 stores control programs, etc.

The RAM 3 temporarily stores data.

The memory 4 stores data mentioned below.

The hard disk drive (HDD) 5 is a database to be reused for ASIC design, as will be described below in detail. The HDD 5 stores software tools, ie. a simulation tool 5a, a logic synthesis tool 5b, a timing analysis tool 5c, a logic simulation tool 5d and a power consumption calculation tool 5e, which are executed by the CPU 1.

The display 6 displays various information.

The keyboard 7 and mouse 8 function as input devices.

The printer 10 performs a print-out operation as a printing apparatus.

Figure 2:
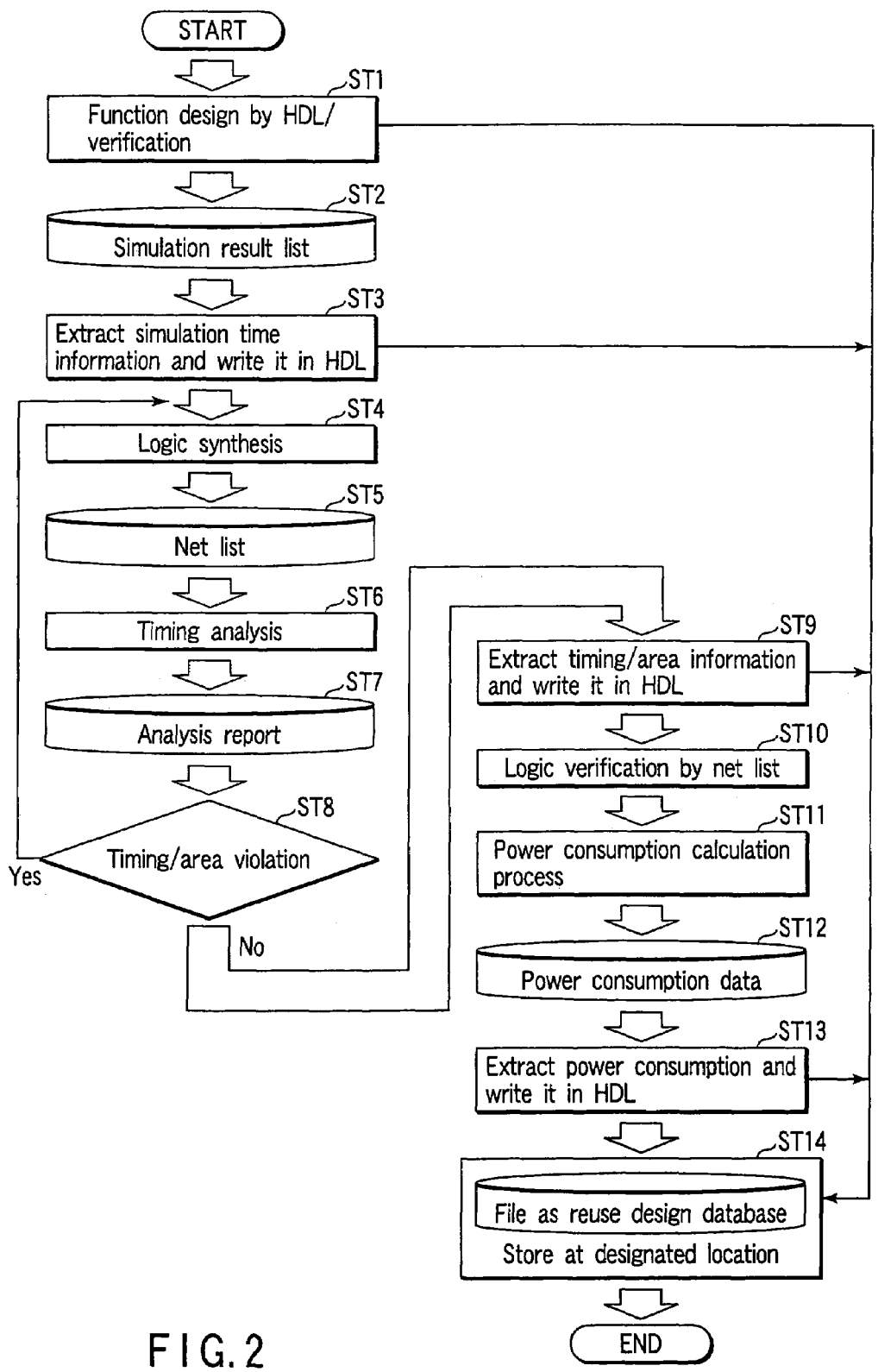
FIG. 2 is a flow chart illustrating the generation of a database and operations for collecting information.

As regards the above-described structure, the generation of a database and operations for information collection using the IC design support apparatus will now be described with reference to a flow chart of FIG. 2.

When a function design by RTL description made in a register transfer level has been carried out using HDL (VHDL, VERILOG) language, the CPU 1 of the IC design support apparatus executes simulation by means of the simulation tool 5a stored in the HDD 5 (ST1).

FIG. 3 shows an example of the function design by RTL description according to the present invention. The RTL description in this invention comprises a header portion and an entity portion. The RTL description is written in the HDD 5 as a reuse design database.

The CPU 1 generates a simulation result list (ST2). In this case, the list may be printed out by the printer 10 or displayed on the display 6.

Figure 4:
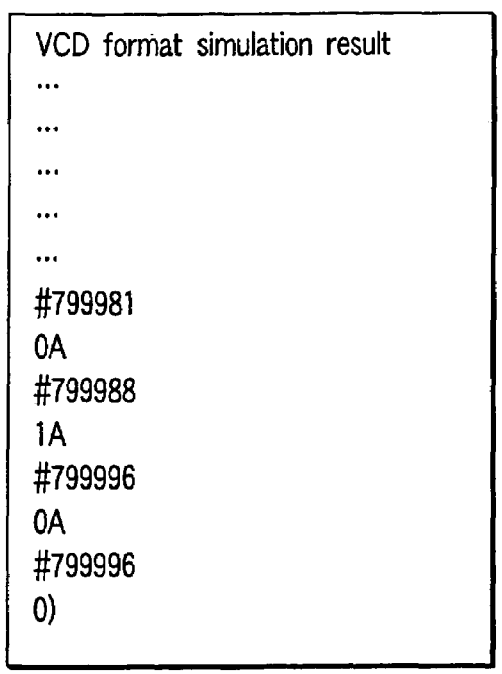
FIG. 4 shows an example of a simulation result.

FIG. 4 shows an example of a simulation result. In FIG. 4, "#799996" represents a simulation time.

The CPU 1 extracts the simulation time (step) from the simulation result list and writes it in the header portion of the executed RTL description (ST3). The simulation time "#799996" nS shown in FIG. 4 is written in the header portion of the RTL description shown in FIG. 3.

Subsequently, the CPU 1 inputs the entity portion of the RTL description to the logic synthesis tool 5b and executes logic synthesis (ST4), and outputs a gate-level net list (ST5).

The CPU 1 inputs the net list to the timing analysis tool 5c and executes a timing analysis (ST6), and outputs an analysis report as an analysis result (ST7). In this case, the analysis report may be printed out by the printer 10 or displayed on the display 6.

FIGS. 5 and 6 show examples of the analysis report. FIG. 5 shows area information, and the total area is "31387.996094". FIG. 6 shows timing information, and the data arrival time is 11-7.70".

The CPU 1 compares the values in the analysis report with pre-input desirable specifications (conditions for design) (ST8). If conditions for timing or layout area of the desirable specifications are not satisfied (area violation), the logic synthesis is executed once again (ST4).

If the conditions for timing and layout area of the desirable specifications are satisfied in step ST8, the CPU 1 extracts the timing information and layout area information and writes the information in the header portion of the executed RTL description (ST9). The layout area information 1131387.996094" gate in the area information shown in FIG. 5 and the timing information "−7.70" ns shown in FIG. 6 are written in the header portion of the RTL description shown in FIG. 3.

The CPU 1 executes a logic simulation for the gate-level net list by the logic simulation tool 5d (ST10). The CPU 1 then inputs the simulation data to the power consumption calculation tool 5d, carries out a power consumption calculation process (ST11) and outputs a power consumption calculation result list (power consumption data) (ST12). In this case, the list may be printed out by the printer 10 or displayed on the display 6.

FIG. 7 shows an example of the power consumption calculation result. In FIG. 7, PowerAVERAGE "5.00071" is a total power consumption.

The CPU 1 extracts power consumption information from the power consumption calculation result list and writes it in the header portion of the executed RTL description (ST13). The power consumption "5.00071" mA in FIG. 7 is written in the header portion of the RTL description in FIG. 3.

At last, the CPU 1 stores the RTL description comprising the header portion and entity portion, as shown in FIG. 3, at a designated location of the HDD 5 as one file (ST14).

As has been described above, according to the embodiment, the processes of steps ST1-3, 4-9, 10-13 and 14 are automated. Thereby, the reuse design data comprises the header portion (information portion) and the RTL description portion (entity portion) and contains data in the same file. Thus, the reuse design database can easily be managed in a unified manner.

In the above embodiment, the four data items, i.e. simulation time, layout area, timing, and power consumption, are written in the information portion (header portion) of the database. Additionally, other necessary information may be written.

According to the above-described embodiment of the invention, there is no need to consume time in constructing a database after the completion of development of an ASIC, and efficient development can be made.

The management of the database can easily be made by unifying the information portion (header portion) and RTL description portion (entity portion) of the database in the same file.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of generating an application specific integrated circuit (ASIC) design database using each piece of software of a simulation tool, a logic synthesis tool, a timing analysis tool, a logic simulation tool, and a power consumption calculation tool when a function design using description data comprising a header portion and an entity portion has been performed, comprising:

executing, simulation by the simulation tool;

generating a simulation result list of the simulation;

extracting a simulation time from the simulation result list;

writing the extracted simulation time in the header portion of the description data;

inputting the entity portion of the description data to the logic synthesis tool and executing a logic synthesis;

outputting a gate-level net list;

inputting the net list to the timing analysis tool and executing a timing analysis;

outputting an analysis report as an analysis result;

comparing values in the analysis report with pre-input desirable specifications;

extracting, if the compared values satisfy the desirable specifications, timing information and layout area information, and writing the timing and layout area information in the header portion of the description data;

executing a logic simulation for the gate-level net list by the logic simulation tool;

inputting simulation data to the power consumption calculation tool and carrying out a power consumption calculation process;

outputting a power consumption calculation result list;

extracting power consumption information from the power consumption calculation result list and writing the power consumption information in the header portion of the description data; and storing, as one file at a predetermined location, the description data comprising the header portion in which the information necessary for reuse is written, and the entity portion.

2. A method of generating an ASIC design database, according to claim 1, wherein the information necessary for reuse, which is extracted from the various execution results of the entity portion, is at least a simulation time, layout area, timing and power consumption.

3. A method of generating an ASIC design database, according to claim 1, wherein the entity portion of said description data is described using a hardware description language.

4. A method of generating an ASIC design database, according to claim 1, wherein the entity portion of said description data is register transfer level (RTL) description data described in a register transfer level.

5. A method of generating an ASIC design database, according to claim 4, wherein the file stored at the predetermined location, information written in the header portion and RTL description data in the entity portion are uniformly managed.

6. A method of generating an application specific integrated circuit (ASIC) design database using each piece of software of a simulation tool, a logic synthesis tool, a timing analysis tool, a logic simulation tool, and a power consumption calculation tool, when a function design using register transfer level (RTL) description data comprising a header portion and an entity portion has been performed, comprising:

executing, simulation by the simulation tool;
generating a simulation result list of the simulation;
extracting a simulation time from the simulation result list;
writing the extracted simulation time in the header portion of the RTL description data;
inputting the entity portion of the description data to the logic synthesis tool and executing a logic synthesis;
outputting a gate-level net list;
inputting the net list to the timing analysis tool and executing a timing analysis;
outputting an analysis report as an analysis result;
comparing values in the analysis report with pre-input desirable specifications;
extracting, if the compared values satisfy the desirable specifications, timing information and layout area information, and writing the timing and layout area information in the header portion of the RTL description data;
executing a logic simulation for the gate-level net list by the logic simulation tool;
inputting simulation data to the power consumption calculation tool and carrying out a power consumption calculation process;
outputting a power consumption calculation result list;
extracting power consumption information from the power consumption calculation result list and writing the power consumption information in the header portion of the RTL description data; and
storing, as one file at a predetermined location, the RTL description data comprising the header portion in which the information necessary for reuse is written, and the entity portion.

7. A method of generating an application specific integrated circuit (ASIC) design database, when a function design has been carried out by an register transfer level (RTL) description composed of a header portion and an entity portion and made in a register transfer level, comprising:

performing, a simulation using a simulation tool with respect to the entity portion of the RTL description;
extracting a simulation time from a simulation result and writing the simulation time in the header portion of the RTL description;
inputting the entity portion of the RTL description to a logic synthesis tool and logic-synthesizing the entity portion, and outputting a gate-level net list;
inputting the output gate-level net list to a timing analysis tool, and outputting a timing analysis result report;
comparing values of the timing analysis result report with preset conditions;
extracting a timing value and a layout area information, which are the result of the analysis, when said conditions are met, and writing the extracted timing value and layout area information in the header portion of the RTL description;
performing a logic simulation using a logic simulation tool with respect to the gate-level net list;
inputting data of the logic simulation to a power consumption calculation tool, and outputting a power consumption calculation result;
extracting a power consumption from the power consumption calculation result, and writing the power consumption in the header portion of the RTL description; and
storing, as one file at a predetermined location, the RTL description comprising the header portion in which the simulation time, and timing value, the layout area information and the power consumption are written, and the entity portion.

* * * * *